(12) United States Patent  (10) Patent No.: US 7,542,151 B2
Van Gastel et al.  (45) Date of Patent: Jun. 2, 2009

(54) METHOD OF PLACING AT LEAST ONE COMPONENT ON AT LEAST ONE SUBSTRATE AS WELL AS SUCH A SYSTEM

(75) Inventors: Josephus M. M. Van Gastel, Veldhoven (NL); Johannes C. Jans, Veldhoven (NL); Rita M. A. Petit, Veldhoven (NL)

(73) Assignee: Assembleon N.V. (NL)

( * ) Notice: Subject to any disclaimer, the term of this patent is extended or adjusted under 35 U.S.C. 154(b) by 309 days.

(21) Appl. No.: 10/550,603

(22) PCT Filed: Mar. 23, 2004

(86) PCT No.: PCT/IB2004/050319

§ 371 (c)(1),
(2), (4) Date: Jul. 24, 2006

(87) PCT Pub. No.: WO2004/086840

PCT Pub. Date: Oct. 7, 2004

(65) Prior Publication Data

US 2007/0165247 A1   Jul. 19, 2007

(30) Foreign Application Priority Data

Mar. 28, 2003 (EP) .................................. 03100813

(51) Int. Cl.
*G01B 11/14* (2006.01)
(52) U.S. Cl. .................... 356/614; 356/400; 29/740; 29/712

(58) Field of Classification Search ......... 356/614–623, 356/339–401; 382/147, 151, 153, 145; 29/832, 29/833, 739, 721, 742, 740, 741, 712
See application file for complete search history.

(56) References Cited

U.S. PATENT DOCUMENTS

| 4,941,256 | A |   | 7/1990  | Capson et al. |
| 4,978,224 | A |   | 12/1990 | Kishimoto et al. |
| 5,739,846 | A | * | 4/1998  | Gieskes ........................ 348/87 |
| 5,880,849 | A |   | 3/1999  | Van De Ven |
| 6,408,090 | B1 |   | 6/2002 | Salomon et al. |
| 6,895,661 | B1 | * | 5/2005 | Gamel et al. ................... 29/740 |
| 7,474,417 | B2 | * | 1/2009 | Albin Lambertine Petit et al. .......................... 356/614 |
| 2001/0055069 | A1 |   | 12/2001 | Hudson |
| 2002/0030736 | A1 | * | 3/2002 | Hudson et al. ................ 348/86 |
| 2006/0048383 | A1 | * | 3/2006 | Nishiwaki et al. ............. 29/833 |
| 2006/0153426 | A1 | * | 7/2006 | Pasqualini et al. .......... 382/107 |
| 2007/0165247 | A1 | * | 7/2007 | Van Gastel et al. .......... 356/614 |

* cited by examiner

*Primary Examiner*—Hoa Q Pham
(74) *Attorney, Agent, or Firm*—Foley & Lardner LLP

(57) ABSTRACT

By means of a method, at least one component is placed on at least one substrate. The component is picked-up by at least one placement machine and is placed at a desired position on the substrate. After the component is placed on the substrate, an image of the component placed on the substrate is taken by a camera. Any difference between the actual position of the component on the substrate and a desired position of the component on the substrate is established on account of the image. The positioning of another component to be placed on the substrate takes into account any such difference.

16 Claims, 8 Drawing Sheets

US 7,542,151 B2

METHOD OF PLACING AT LEAST ONE COMPONENT ON AT LEAST ONE SUBSTRATE AS WELL AS SUCH A SYSTEM

BACKGROUND

The invention relates to a method of placing at least one component on at least one substrate, wherein the component is picked-up by means of at least a placement machine and placed on a desired position on the substrate. The invention also relates to a system suitable for executing such a method.

One such method and system are disclosed in U.S. Pat. No. 5,880,849 in which an image of a substrate is made by a camera. From the image, a desired position relative to the substrate of a component to be placed on the substrate is established. Then, the placement machine is driven and the component is placed on the substrate. By means of this method and system, however, it is impossible to check to see whether the component is really placed on the substrate at the desired position.

SUMMARY

An object of the present invention to provide a method by which the placement of a component on a substrate can be improved in a simple manner.

This object is achieved by the method according to the invention in that after the component has been placed on the substrate, an image of the component placed on the substrate is made by a camera. Any difference between the actual position of the component on the substrate and the desired position of the component on the substrate is then established on the basis of the image. Subsequently, the positioning of a next component to be placed is adapted to account for any such difference.

From the image produced by means of the camera, the actual position of the component relative to the substrate can be determined in a simple manner. Any difference is then established between the desired and actual positions of the component placed on the substrate. If the component is correctly positioned on the substrate, there will be no substantial difference between the desired and actual positions of the component on the substrate. However, if a difference exists, in the method according to the invention, the difference is taken into account by the placement machine drive when positioning another component on the substrate. The camera can either form part of the placement machine or form part of a device set up next to or at a distance from the placement machine. Finding the difference between the actual and desired positions as well as adapting a positioning of a next component based on the difference found, may take place both online and/or offline.

According to an embodiment of the method according to the present invention, first a same kind of component is placed on a number of substrates at substantially the same positions and differences between the desired and actual positions of the components relative to the associated substrates are determined. The positioning of a next component to be placed on a next substrate is then adapted on account of the differences (if any) identified. In this manner, deviations between the desired and actual positions of the component due to incidental deviations due to what are called stochastic errors (e.g., friction in the placement machine, dynamic vibrations, measuring error, etc.) over a number of substrates are identified when positioning a subsequent component. However, if an error repeats itself at nearly every substrate, this error (which may be, e.g., the result of calibration rest errors, the stretching of the substrate due to temperature changes, machine wear, errors in a relatively large number of the same substrates relative to the expected and actual location of, for example, track patterns on a substrate etc.) is called a deterministic error. When the deviations are identified, deviations in substrates that were manufactured earlier are counted less strongly than deviations in a substrate that was manufactured just before the substrate now to be provided with components.

According to a further embodiment of the method according to the present invention, first a number of different components are positioned on at least one substrate. The actual positions of the components are compared with desired positions thereof, subsequent to which the positioning of a next component to be placed on the substrate or another substrate is adapted based on a statistically determined average difference. In this way, the differences may be determined of, for example, all of the components placed by a certain placement machine.

According to a further embodiment of the method according to the present invention, once a number of components have been placed, the actual positions may be compared with the desired positions. In this way, determining the actual position of the component relative to the substrate can take place independently of the placement of the component on the substrate. A disadvantage of this approach, however, is that not until a number of components have been placed will there be established whether these components have really been positioned at the desired positions. thereby creating the desired feedback.

According to another embodiment of the method according to the present invention, once each component has been placed, the actual position may be compared with the desired position. In this way, there may be a direct coupling once a component has been placed. If the time for determining the difference between the actual and desired positions of the component is relatively short, this approach does not have a disadvantageous effect on the time necessary for placing the component.

According to yet another embodiment of the method according to the present invention, components may be placed on at least a substrate by means of a number of placement machines located side-by-side. Each placement machine includes, among other possible things, a camera by means of which an image of at least a portion of the substrate is produced to determine the difference between the desired and actual positions of the component placed on the substrate. In this way, it is possible to examine a portion of the substrate by means of each camera, thereby enhancing accuracy whereas the time required for analyzing each image remains relatively limited.

Another object of the present invention is to provide a system with which components can be placed on a substrate more accurately.

This object is achieved with the system according to the present invention. The system is provided with at least a placement machine and a camera that cooperates with the placement machine. An image of a component positioned on a substrate by means of the placement machine may be produced by the camera. The placement machine is further provided with a control scheme by means of which a difference between an actual position and a desired position of the component relative to the substrate can be determined from the image produced by the camera. In this manner, a difference between the actual position and the desired position of a component on a substrate can be determined in a relatively simple manner. If the placement machine already has a camera, for example, for determining the desired position on the substrate with the camera, an image can be made by the same camera both prior to and subsequent to the placement of the component, i.e., another camera does not need to be added to the placement machine.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
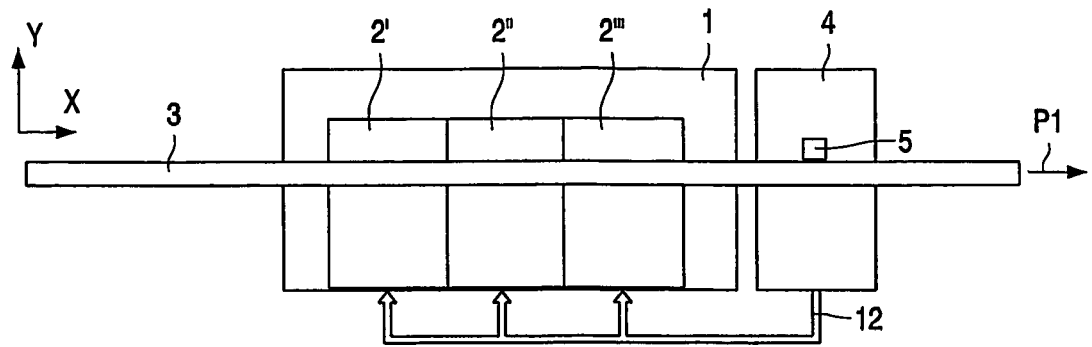
FIGS. 1-5 show plan views of various embodiments of systems according to the invention.

Efforts have been made throughout the drawings to use the same or similar reference numerals for the same or like components.

FIG. 1 shows a system 1 for placing components on a substrate. The system 1 comprises three placement machines 2', 2", 2''' located side-by-side. The substrates to be provided with the components are transported through the system 1 in the direction indicated by arrow P1 by means of a transport system 3. Such a system is disclosed in previously mentioned U.S. Pat. No. 5,880,849 and will, therefore, not be further explained.

Figure 9:
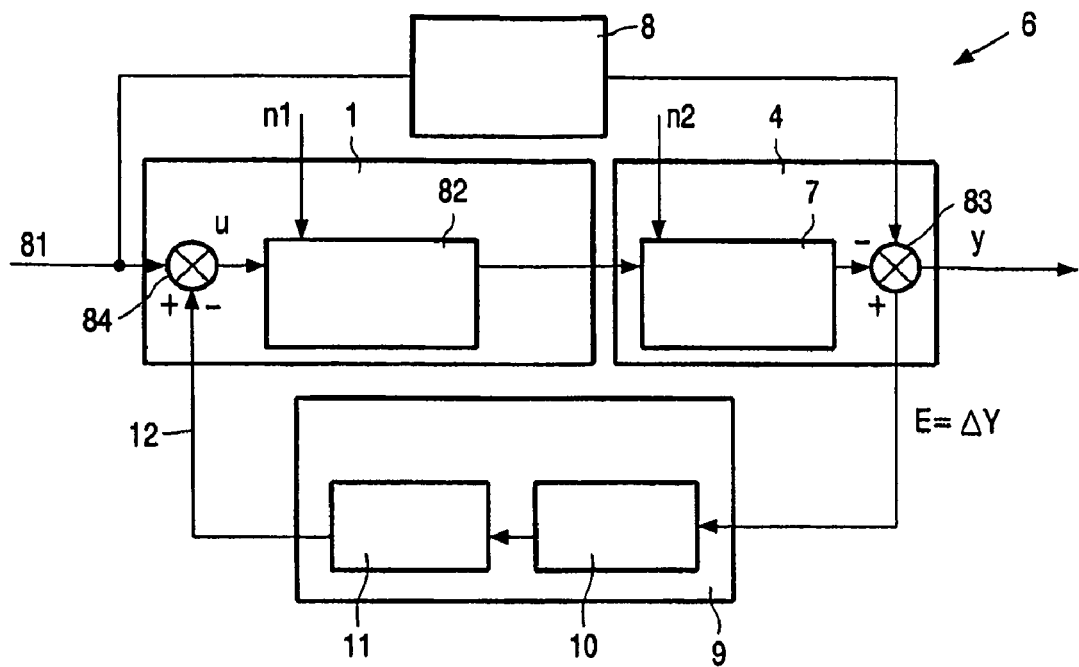
FIG. 9 shows a control protocol of a method in which feedback takes place online.

Downwards of the system 1 is located a device 4 that has a camera 5 by means of which images of a substrate provided with components can be produced. The images made by the camera 5 are fed to a control protocol 6 (FIG. 9). The positions of components placed on the substrate relative to the substrate are determined by means of the control protocol 6. The control protocol 6 further contains the desired positions 8 in a unit. In element 83, the difference between the desired positions and the actual positions, which are stored in a unit 7, is determined. The difference E=ΔY is subsequently fed to a controller 9 included in the control protocol 6. In the controller 9, after filtering by a low-pass filter 10, a feedback signal 12 is calculated by means of a calculation algorithm 11. The feedback signal 12 serves to adjust the control of the individual placement machines 2', 2", 2'''. The difference E may include both deviations in X, Y and N-direction. This feedback signal 12 may be adjusted per machine. In this way, it is possible to increase the accuracy with which a next component is placed on a next substrate. In the embodiment shown in FIG. 1, the system 1 and the device 4 are separate entities.

Figure 2:
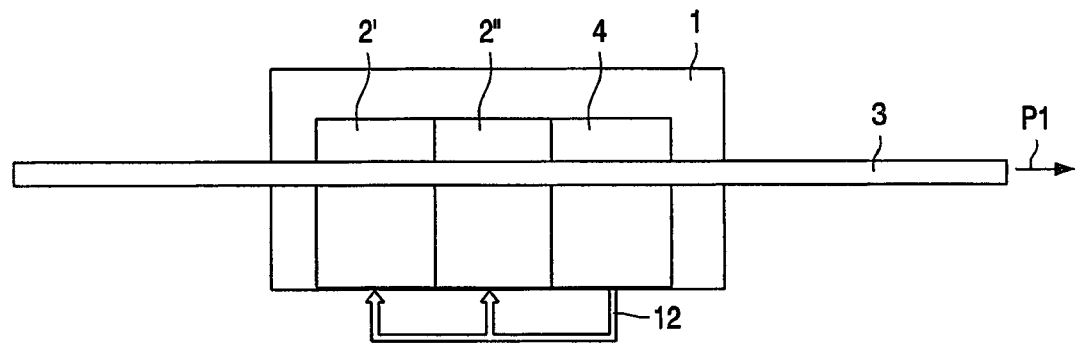

FIG. 2 shows an embodiment in which the device 4 is integrated with the system 1 and is installed adjacent to placement machines 2', 2". The functioning of the system shown in FIG. 2 corresponds to that shown in FIG. 1.

Figure 3:
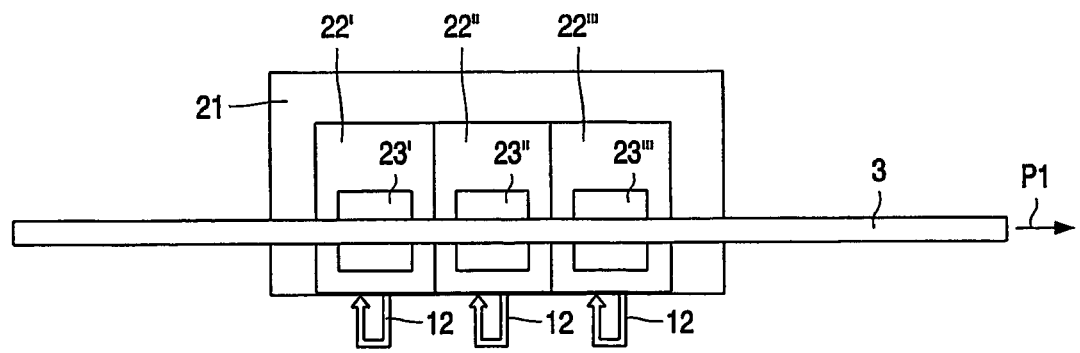

FIG. 3 shows another embodiment of a system 21 according to the invention that comprises three adjacent placement machines 22', 22", 22'''. Each of the placement machines 22', 22", 22''' is provided with an associated camera 23', 23", 23''' as well as a control protocol belonging to each camera. By means of the system 21 shown in FIG. 3, the deviation between the actual position of the component and the desired position is determined by means of the camera 23', 23", 23''' present in the associated machine 22', 22" and 22''' immediately after the placement of component on a substrate. In this way, there is a direct feedback signal 12.

Figure 4:
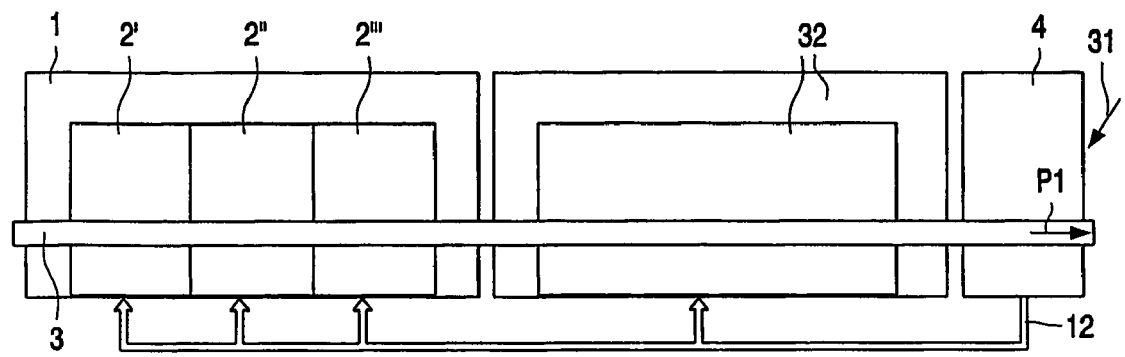

FIG. 4 shows an embodiment of a system 31 according to the invention that comprises a system 1 shown in FIG. 1, a placement machine 32 installed beside it and a device 4 installed beside the latter. The operation of the system 31 shown in FIG. 4 corresponds to the system shown in FIG. 1. An advantage of such a system 31 is that not each individual placement machine 2', 2", 2''', 32 needs to have a camera. A disadvantage, however, is that from a substrate on which a component has been placed by means of a placement machine 2', the actual positions of the components are not determined by means of the device 4 until a relatively large number of other substrates have been provided with components by placement machine 2'. In this way, feedback is relatively slow.

Figure 5:
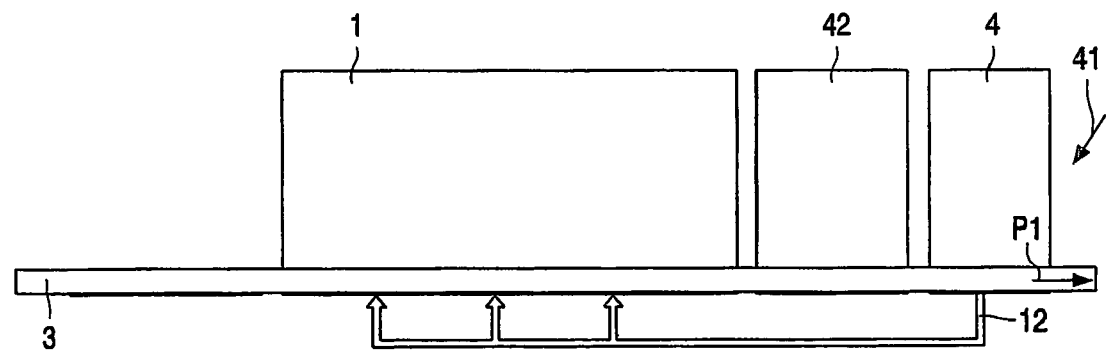

FIG. 5 shows yet another embodiment of a system 41 according to the invention in which a system 42 is installed between the system 1 comprising placement machines 2', 2", 2''' and the device 4. With the aid of the system 42, the component placed on the substrate is affixed to the substrate. Such a system 42, such as, for example a wave soldering device, is known per se and will, therefore, not be further explained. While the component is placed on the substrate, undesired displacements of the components relative to the substrate may occur, which are not caused by placement inaccuracies.

Figure 6A:
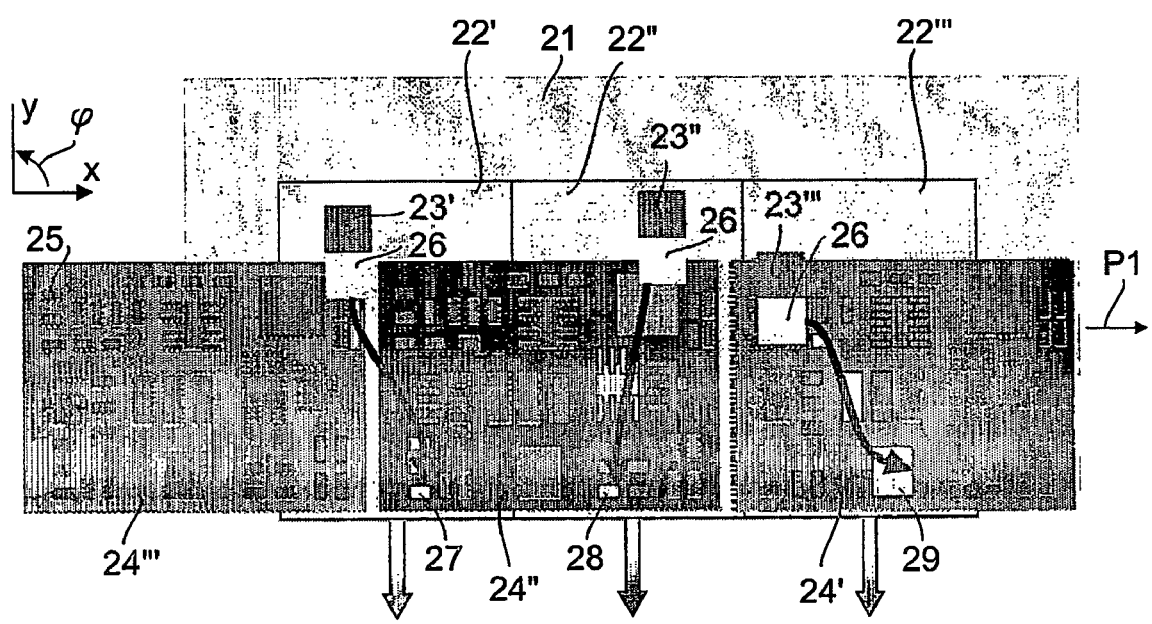
FIGS. 6A-6C show plan views of a system according to the invention, the figures showing substrates at different positions.
Figure 6B:
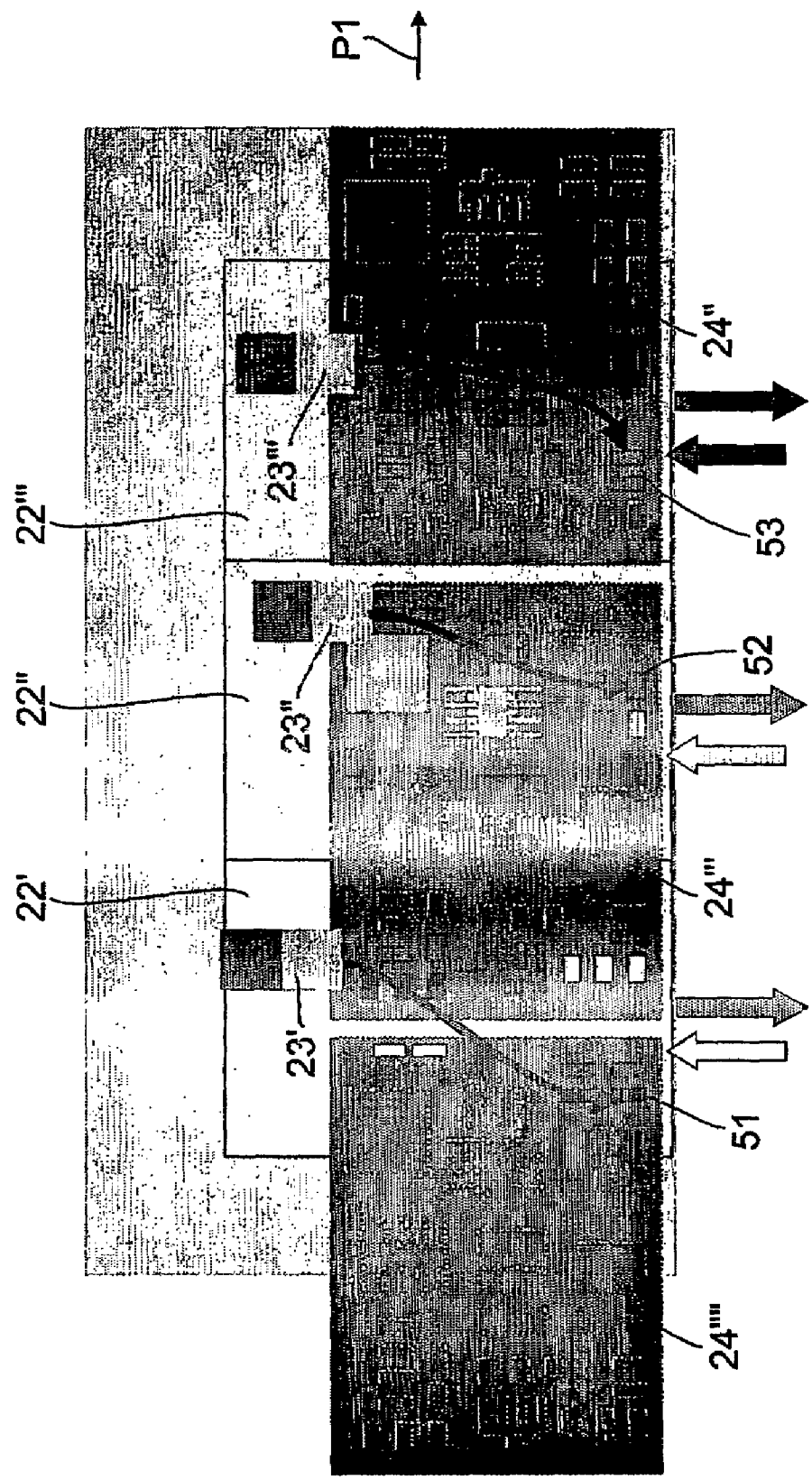
Figure 6C:
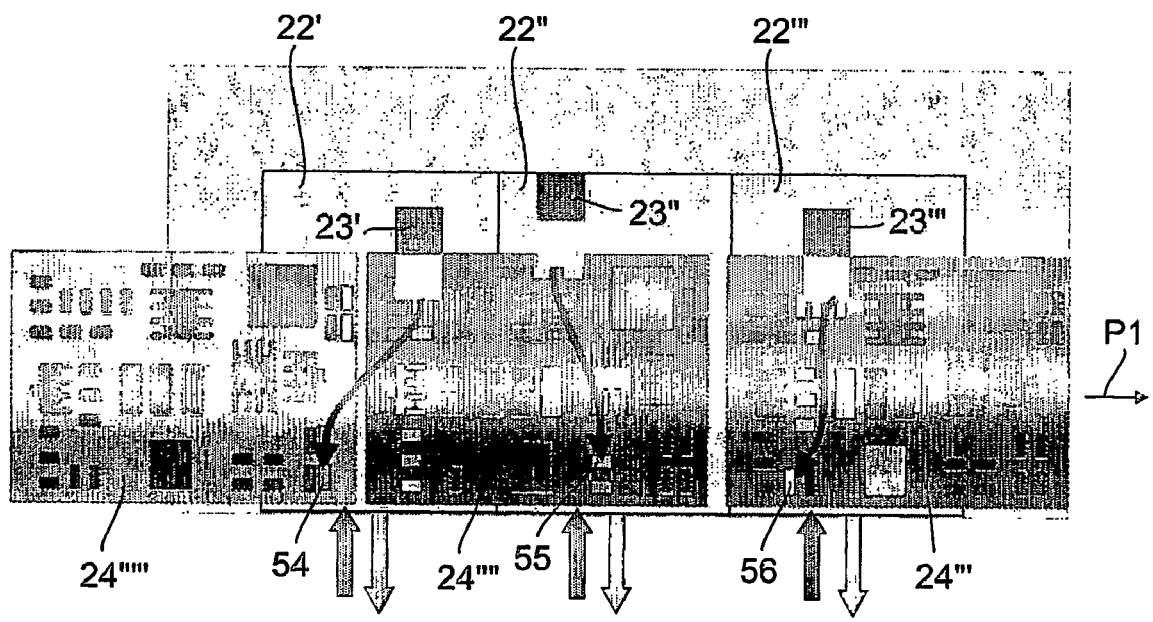

FIGS. 6A-6C show the system 21 represented in FIG. 3, in which each placement machine 22', 22", 22''' comprises an associated camera 23', 23", 23'''. This system 21 largely corresponds to the system known from U.S. Pat. No. 5,880,849, in which the cameras 23', 23", 23''' are used only for determining a desired position of a component on the substrate and not for determining the actual position of the component on the substrate subsequent to the placement of the component on the substrate.

In the situation shown in FIG. 6A, three substrates 24', 24", 24''' are located in the system 21. For simplicity, the substrates show both the components 27-29 already placed and the components 25 still to be placed. Once the substrates 24', 24", 24''' have been situated in the placement machines 22', 22", 22''', a pick-up device 26 mounted beside the camera 23' picks up a component from a feeding device (known per se) by the displacement of the pick-up device 26 (and the camera going with it) in the directions shown by the arrows X, Y. Then, a desired position on a substrate 24'''-24' is determined with the aid of the associated camera 23'-23'''. Subsequently, the component is placed on the substrate by means of the pick-up device 26. Then an image of a portion of the substrate 24'-24''' is made by means of the camera 23'-23'''. This may be the portion on which a component is placed by means of the respective placement machine, but it is alternatively possible during the displacement of the pick-up device 26 and the associated camera 23'-23''' to make several substrate images of portions that already contain components. In the situation shown in FIG. 6A, an image of the component 27 on substrate 24" is made by camera 23', an image of the component 28 on substrate 24" is made by camera 23", and an image of the component 29 on substrate 24' is made by camera 23'''.

Then, as shown in FIG. 6B. the substrates 24'-24''' are moved in the direction indicated by arrow P1 after which the substrate 24''' is largely located in the placement machine 22''', the substrate 24''' is largely located in the placement machine 22' and partly in the placement machine 22'', and a new substrate 24'''' is partly located in the placement machine 22'. Subsequently, components are placed on the substrates 24''-24'''' by means of the pick-up devices 26. Subsequently, the camera 23' produces an image of the component 51 on substrate 24'''', the camera 23'' produces an image of the component 52 on substrate 24''', and the camera 23''' produces an image of the component 53 on the substrate 24''. As a result, positions of measured components on substrate 24'' can be corrected when components are placed on substrate 24'''. This provides a relatively fast feedback.

After the substrates have again been moved in the direction indicated by the arrow PI, the situation shown in FIG. 6C is obtained. In the manner previously described, a camera 23' produces an image of a component 54 on substrate 24'''''', a camera 23'' produces an image of a component 55 on substrate 24'''''', and a camera 23''' produces an image of a component 56 on substrate 24'''.

From the images thus produced, the actual position of both component 52 and component 56 relative to the substrate 24''' can be established. In the situation shown in FIGS. 6A-6C, each camera produces only one image of a single substrate. Of course, while the cameras 23''-23''' are moved over a substrate in the XY plane, various images can be produced. By means of a control protocol these images may then be combined to create a complete image of a single substrate, thereby providing information about the positioning accuracy of a number of components on a substrate.

Figure 7:
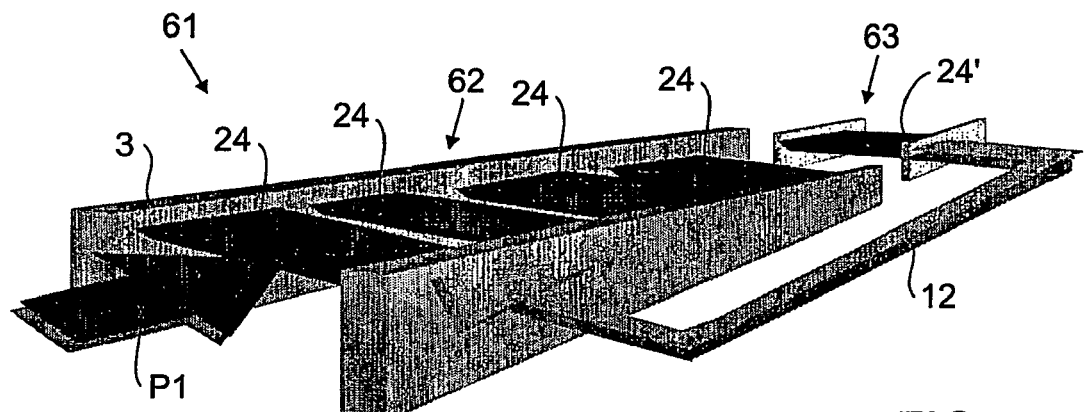
FIG. 7 shows a perspective view of a system according to the invention.

FIG. 7 shows a perspective view of a system 61 according to the invention. Although the system 61, largely corresponds to the system shown in FIG. 1, a separate, camera-equipped machine 63 is installed side-by-side with a placement machine 62. The embodiment shown in FIG. 7 clearly shows that producing an image of a substrate 24' and determining possible corrections therefrom can only have an effect on a substrate that is located totally on the left, in the situation shown in FIG. 7. The system 61, however, does not effect the three substrates 24 situated therebetween. As a result, the feedback signal 12 is relatively slow.

FIGS. 8A-8D show a similar image 71 from which the desired information, which is dependent on the desired positioning accuracy, the desired speed etc., can be derived. In the image 71 shown in FIG. 8A, the arrows 72 indicate that, for each of the components 25 present on the substrate 24, the actual position of the component 25 relative to the substrate 24 is determined. Then, in the control protocol 6 the actual position of each component 25 is compared with the desired position. Of course, such a process may require a relatively large amount of calculation time in the control protocol 6.

Figure 8A:
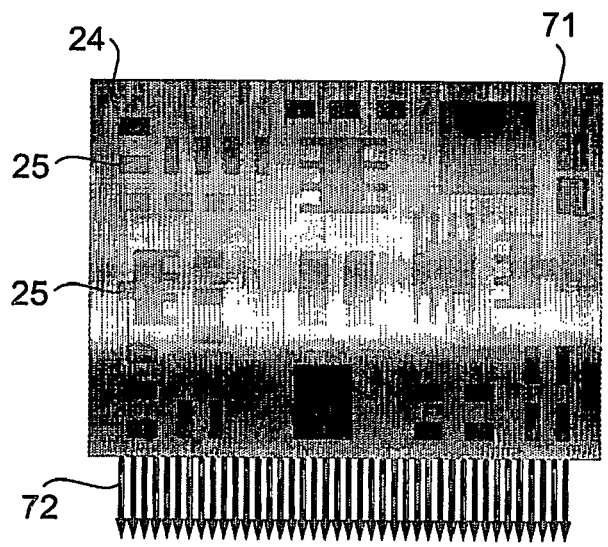
FIGS. 8A-8D show different ways of analyzing an image.
Figure 8B:
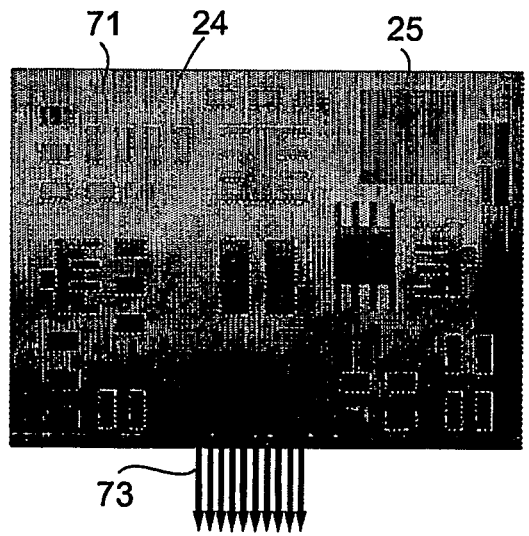

Therefore, it is alternatively possible to determine, as is shown in FIG. 8B, the actual position relative to the substrate 24 of only a few components 25. The amount of information to be fed to the control protocol 6, which information is shown by means of arrows 73, is considerably smaller than in the situation shown in FIG. 8A. Preferably, the components 25, whose positioning accuracy has to be relatively great to guarantee a proper functioning of the substrate 24, are then selected.

Figure 8C:
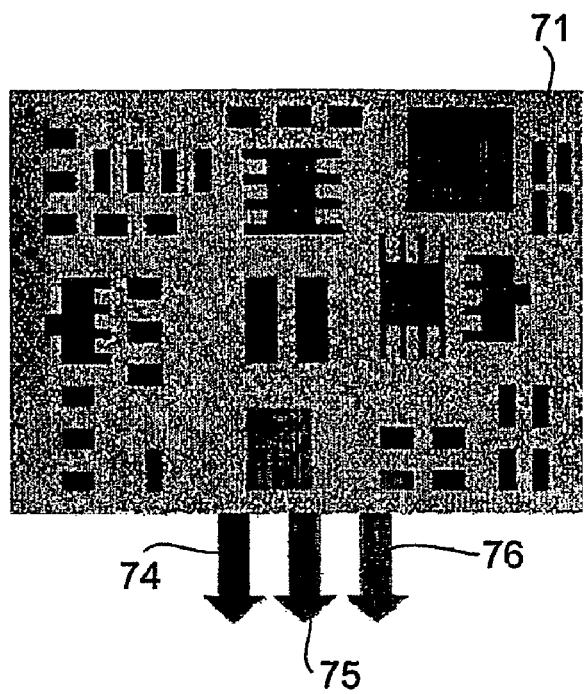

In the situation shown in FIG. 8C, the arrows 74, 75, 76 indicate that only the actual positions of a number of components 25, which are positioned by means of the placement machines 22', 22'', 22''', are determined. In this way, it is possible to individually optimize the accuracy of each placement machine 22', 22'', 22''' by means of statistics (e.g., an average per placement machine).

Figure 8D:
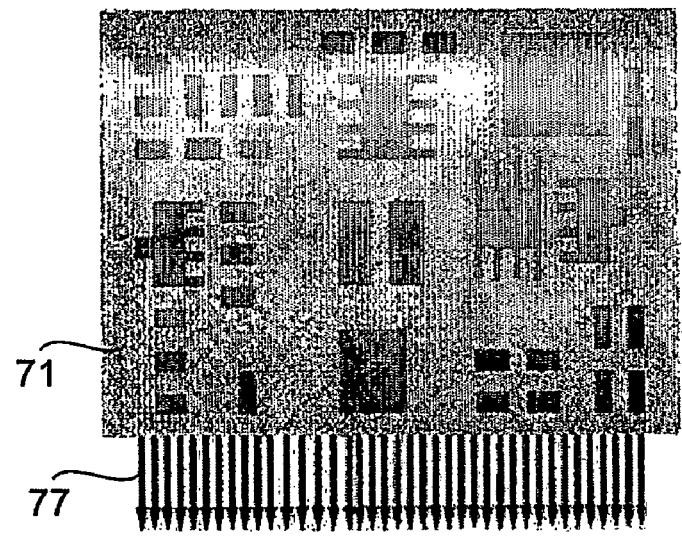

In the situation shown in FIG. 8D, the image 71 is obtained from joining images produced by means of separate cameras 23', 23'', 23'''. In this way, no extra camera is needed to produce the image 71, but use can be made of cameras 23', 23'', 23''' already present in the placement machines 22', 22'', 22'''. The information 77 obtained from the individual images, as well as the joint image 71, can be relatively extensive. This method is particularly suitable if the measuring time and processing time is longer than the time necessary for placing a component on a substrate.

It is alternatively possible to produce a number of different images of different regions of different substrates by means of a single camera. Subsequently, a joint image may be assembled from all of the images.

FIG. 9 shows a control protocol 6 of an online situation in which components are placed on a substrate by means of a system 1. After placement of the components, images of the components placed on the substrate are produced by means of the device 4. Information 81 relating to the desired positions of the component on the substrate is fed to the control protocol 6. These desired positions are stored in a unit 8. The desired positions are corrected via the feedback signal 12, after which the value U thus obtained is fed to the placement machines 2', 2'', 2'''. These placement machines 2', 2'', 2''' are shown by block 82 in the control protocol 6. Components are positioned on the substrates on the basis of this information. Deviations nl owing to, for example, friction, measuring errors, wear and vibrations may then occur. Deterministic errors are part of the placement process (e.g., the placement process may show adjustment errors). Subsequently, images of the component's actual position are produced by the device 4. This is shown as block 7 in FIG. 9. During the production of the images, deviations n2, which may be the result of measuring noise and calibration errors when the camera is positioned over the substrate, may occur. In an adding element 83, the actual component positions relative to the substrate calculated from the images are compared with the desired component positions relative to the substrate known from unit 8. The resulting difference $E=\Delta Y$ is fed to a low-pass filter 10 and then processed in unit 11, after which a feedback signal 12 is obtained. In adding element 84, this feedback signal 12 is then combined, as previously described, with information 81 with regard to the desired position of components on a substrate.

Figure 10:
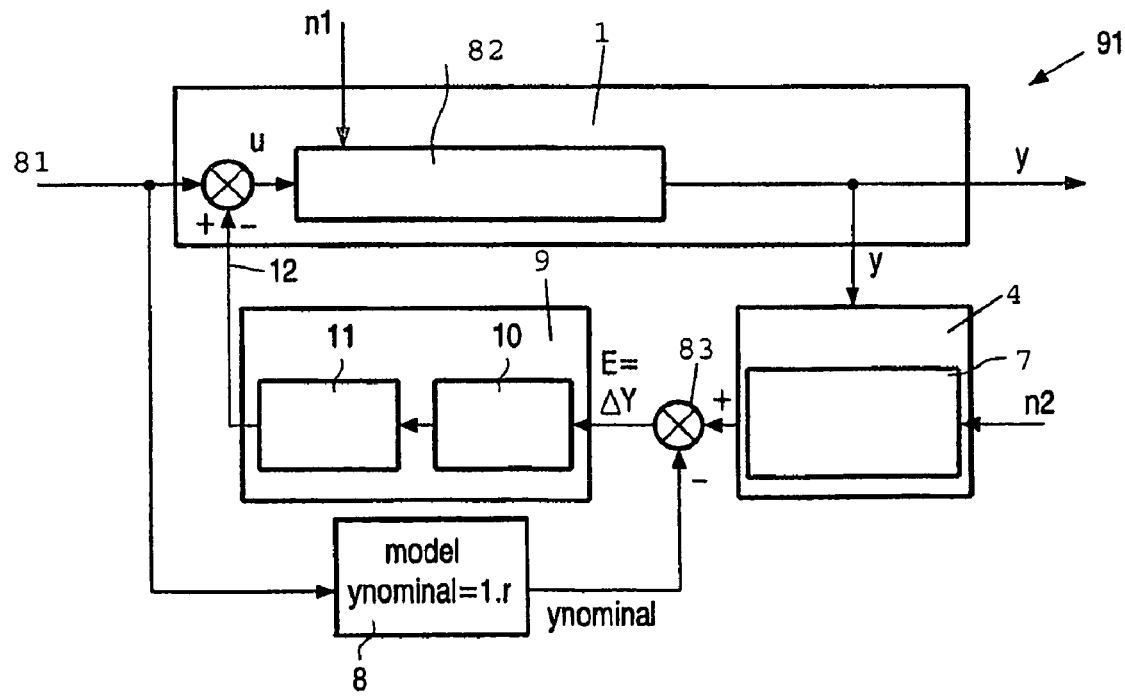
FIG. 10 shows a control protocol of a method in which feedback takes place offline.

If a relatively large amount of information is to be processed, which may be impossible within a period of time necessary for placing components on a substrate, it may be better to produce images for detecting deviations between actual and desired positions of components on a substrate offline rather than online. This method, as well as the control protocol 91 necessary for this method, is shown in FIG. 10. The control protocol 91 largely corresponds with the control protocol 6, which is shown in FIG. 9, except that the device 4 is not installed near the system 1. Instead, the device 4 is completely separated from system 1. For example, the device 4 can be installed in a separate laboratory. Of course, as a result of the offline detection of differences between actual and desired positions of components on a substrate, a relatively large time delay may result between the moment the components are placed on the substrate and when the driving of the placement machines is adapted for component placement on a next substrate.

It is alternatively possible to both verify the positions of a limited number of components online and verify the positions of all components offline.

It is possible to process, in the algorithm 11, information of the actual and desired positions of a specific component as it is positioned on a number of substrates. This may provide an average over time of the actual and desired positions by the use of, for example, digital filters.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A method of placing components on at least one substrate by a plurality of placement machines located side by side, the method comprising the steps of:
    picking up a first component with a first placement machine;
    placing the first component on a substrate;
    imaging the first component placed on the substrate;
    determining, using the image of the first component, if any difference exists between an actual position of the first component on the substrate and a predetermined desired position of the first component on the substrate;
    picking up a second component with a second placement machine; and
    placing the second component at another desired position on the substrate, while taking into account any such difference of the actual position of the first component on the substrate and the predetermined desired position of the first component on the substrate.

2. The method according to claim 1, wherein at least one of the first and second placement machines comprises a camera, and wherein the step of imaging the first component placed on the substrate is accomplished using the camera of either or both of the first and second placement devices.

3. The method according to claim 1, wherein both of the first and second placement machines comprises a camera, and wherein the step of imaging the first component placed on the substrate is accomplished using the cameras of both of the first and second placement devices.

4. The method as claimed in claim 3, wherein a joint image of the substrate and the first component positioned thereon is produced from images produced by both of the cameras.

5. The method according to claim 1, wherein each of the plurality of placement machines includes a robot movable in an X-Y direction with respect to the substrate independent from movement of a robot of an adjacent placement machine.

6. A method of placing components on substrates by a plurality of placement machines located side by side, the method comprising the steps of:
    picking up a plurality of first components with at least one first placement machine;
    placing the plurality of first components at substantially the same positions on corresponding substrates;
    imaging the first components placed on the substrates;
    determining, using the images of the first components, if any difference(s) exists between an actual position of each of the first components on the corresponding substrates and predetermined desired positions of each of the first components on the corresponding substrates;
    picking up at least one second component with at least one second placement machine; and
    placing the at least one second component at another desired position on one of the substrates, while taking into account any such difference of the actual position of each of the first components on the corresponding substrates and the predetermined desired positions of each of the first components on the corresponding substrates.

7. The method according to claim 6, wherein at least one of the second placement machines comprises a camera, and wherein the step of imaging the first components placed on the corresponding substrates is accomplished using the camera(s).

8. The method according to claim 6, wherein each of the placement machines comprises a camera, and wherein the step of imaging the first components placed on the corresponding substrates is accomplished using each of the cameras.

9. The method as claimed in claim 8, wherein joint images of each substrate and the first component positioned thereon are produced from images produced by the cameras.

10. The method according to claim 6, wherein each of the plurality of placement machines includes a robot movable in an X-Y direction with respect to a substrate independent from movement of a robot of an adjacent placement machine.

11. A method of placing components on at least one substrate by a plurality of placement machines located side by side, the method comprising the steps of:
    picking up a plurality of first components with at least one first placement machine;
    placing the plurality of first components on a substrate;
    imaging the first components placed on the substrate;
    determining, using the images of the first components, if any difference(s) exists between an actual position of each of the first components on the substrate and a predetermined desired position of each of the first components on the substrate;
    picking up a second component with a second placement machine; and
    placing the second component at another desired position on the substrate, while taking into account any such difference of the actual position of each of the first components on the substrate and the predetermined desired position of each of the first components on the substrate.

12. The method according to claim 11, further comprising the step of:
    averaging statistically the difference(s) between the actual and desired positions of each of the first components on the substrate.

13. The method according to claim 11, wherein at least one of the placement machines comprises a camera, and wherein the step of imaging the first components placed on the substrate is accomplished using the camera.

14. The method according to claim 11, wherein each of the placement machines comprises a camera, and wherein the step of imaging the first components placed on the substrate is accomplished using each of the cameras.

15. The method as claimed in claim 14, wherein a joint image of the substrate and the first components positioned thereon is produced from images produced by each of the cameras.

16. The method according to claim 11, wherein each of the plurality of placement machines includes a robot movable in an X-Y direction with respect to the substrate independent from movement of a robot of an adjacent placement machine.

* * * * *